United States Patent [19]

Miyamoto et al.

[11] Patent Number: 4,680,735
[45] Date of Patent: Jul. 14, 1987

[54] SEMICONDUCTOR MEMORY DEVICE

[75] Inventors: Junichi Miyamoto; Jun-ichi Tsujimoto, both of Yokohama, Japan

[73] Assignee: Kabushiki Kaisha Toshiba, Kawasaki, Japan

[21] Appl. No.: 759,142

[22] Filed: Jul. 26, 1985

[30] Foreign Application Priority Data

Sep. 21, 1984 [JP] Japan ............................ 59-197924

[51] Int. Cl.$^4$ ................................................ G11C 7/02
[52] U.S. Cl. ..................................... 365/210; 365/205
[58] Field of Search ............... 365/203, 205, 208, 210, 365/200, 207; 307/355, 279

[56] References Cited

U.S. PATENT DOCUMENTS 4,169,233 9/1979 Haraszti ........................ 365/205 X
4,558,241 12/1985 Suzuki et al. ................... 365/205 X

OTHER PUBLICATIONS

K. Natori, et al., "A 34 ns 256K Dram," IEEE International Solid-State Circuits Conference, ISSCC Digest of Technical Papers, p. 232–233, 1983.

Primary Examiner—Joseph A. Popek
Attorney, Agent, or Firm—Finnegan, Henderson, Farabow, Garrett & Dunner

[57] ABSTRACT

A sense amplifier comprising a flip-flop circuit is provided for each bit line pair. A first transistor is connected between the flip-flop circuit and $V_{DD}$ power source. A second transistor is connected between the flip-flop circuit and ground. A control signal for controlling the active state of the flip-flop is applied to the gate of the first transistor, with a minimum time delay. The control signal is also applied to the gate of the second transistor, with a time delay corresponding to that caused by the word line. The timing for rendering each flip-flop circuit in the active state is substantially coincident with the optimum timing of a change in potential on each corresponding bit line.

8 Claims, 16 Drawing Figures

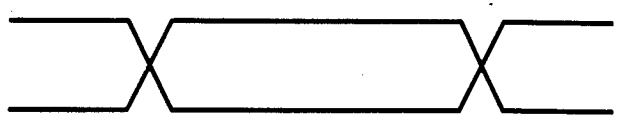
FIG. 6A  Add
FIG. 6B  P1
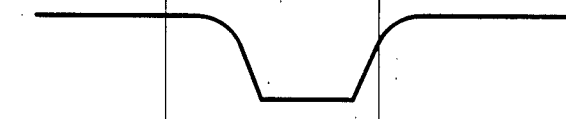
FIG. 6C  P2
FIG. 6D  SENSE AMP
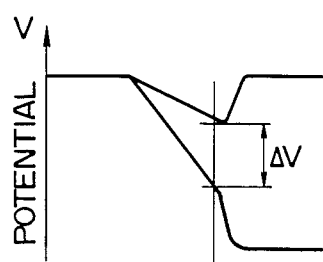
FIG. 7
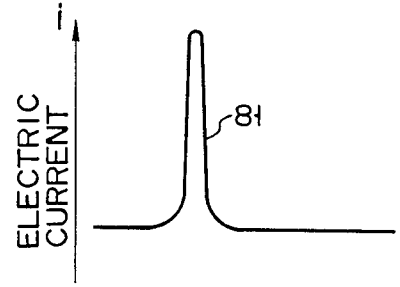
FIG. 8
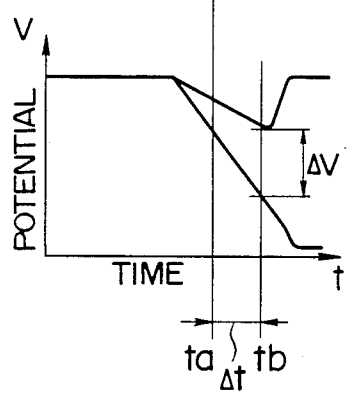
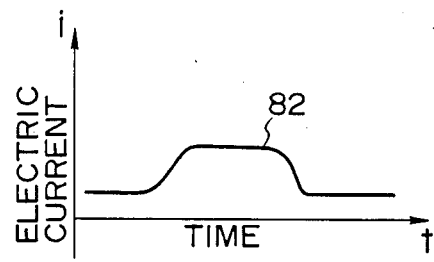
FIG. 9

SEMICONDUCTOR MEMORY DEVICE

BACKGROUND OF THE INVENTION

The present invention relates to a semiconductor memory device using a flip-flop circuit as a data sensing means, and more particularly to a semiconductor memory device in which an improvement is made on the delay problem of a drive signal on the word line.

In the field of semiconductor memory devices, it has been recognized that a sense amplifier based on a flip-flop circuit has good sensitivity. It is for this reason that this type of sense amplifier has been widely used in dynamic RAMs (random access memories) of the open bit line system or the folded line system, EPROMs (erasable programmable read only memories), and EEPROMs (electrically erasable read only memories).

In FIG. 1, there is shown a latch sense amplifier of the open bit line system, which has been prevalently used in the memory device. A flip-flop 11 includes P- and N-channel MOS transistors. A pair of bit lines 12 and 14 are connected to both sides of the flip-flop 11, as shown. The bit line 12 as illustrated on the left side of the flip-flop 11 has a memory cell 13 connected thereto. The bit line 14 on the right side of the flip-flop 11 has a dummy cell 15. The memory cell 13 is of the EPROM type in which logical 1 or "0" of data is stored dependent on the conductance of the transistor contained therein. The conductance of the dummy cell 15 is selected to have an intermediate value between the two conductances of the memory cell 13 respectively corresponding to logical "1" and "0" stored therein.

In the flip-flop 11, during a precharge period, precharge transistors 18 and 19 and an equalizing transistor 20 are placed in an on-state. Potentials 21 and 22 on the pair of bit lines 12 and 14 are set at an equal potential, as shown in FIG. 2. At this time, the transistors 16 and 17 respectively inserted between the flip-flop 11 and a power source $V_{DD}$ and between the flip-flop 11 and a power source $V_{SS}$, are in an off-state under the control of signals applied to the gates thereof. Under this condition, the flip-flop 11 is in an inactive state. In the inactive state of the flip-flop 11, if the precharging and the equalizing operations are stopped, a conductance difference between the memory cell 13 and the dummy cell 15 causes a potential difference $\Delta V$ between the potentials 21 and 22 on the bit lines 12 and 14 (see FIG. 2). The potential difference $\Delta V$ grows with time. When it becomes satisfactorily large, the transistors 16 and 17 are turned on to render the flip-flop 11 active in state. In the active state, the potential difference between the bit lines 12 and 14 is amplified by the flip-flop 11. The potential 22 on the bit line 14 in the low level rapidly becomes lower in level. The potential 21 on the bit line 12 in the high level becomes higher, rapidly.

In practical use, a number of the memory circuits shown in FIG. 1 are arrayed as shown in FIG. 3. A plurality of pairs of bit lines 12 and 14 are wired, as shown, and respectively coupled with sense amplifiers 30 each containing a flip-flop 11 and transistors 16 and 17 for controlling the active state of the flip-flop. Each bit line 12 is coupled with a memory cell 13. Each bit line 14 is coupled with a dummy cell 15. The gates of the transistors constituting the memory cells 13 are coupled together by word lines $32_1$ led from word line decoder/driver $31_1$. The gates of the transistors constituting the dummy cells 15 are coupled together by word lines $32_2$ led from word line decoder/driver $31_2$. Accordingly, decoded signals are applied from the decoder/driver $31_1$ to the gates of the transistors constituting the memory cells 13. Decoded signals are applied from the decoder/driver $31_2$ to the gates of the transistors constituting the dummy cells 15. Each of the word lines $32_1$ and $32_2$ is inevitably accompanied by parasitic resistance R and parasitic capacitance C.

The word lines $32_1$ and $32_2$ cross over the bit lines 12 and 14, respectively. In fabricating such a memory device by the IC technology, the word line 32 (expressing the word lines $32_1$ and $32_2$) must be made of material different from that of the bit line 12/14 (expressing the bit lines 12 and 14). Usually, aluminum is used for the bit line 12/14 and polycrystal silicon for the word line 32. The word line 32 made of polycrystal silicon has a higher resistivity than the bit line 12/14 made of metal such as aluminum. Therefore, a large parasitic capacitance is caused between the word line 32 made of polycrystal silicon and the substrate. Further, since the length of the word line 32 is relatively long, the resistance and capacitance parasitic on the word line 32 are large. Therefore, the drive signal transmitted through the word line 32 is progressively delayed. That is, the drive signal suffers from a called word line delay. This delay time is large, 40 ns to 50 ns, in the case of an EEPROM of 256 Kilo bits. Due to this word line delay, the time variation of a potential on the bit line 12/14 close to the decoder/driver 31 (expressing the decoder/drivers $31_1$ and $31_2$) during the precharge period is different from that on the bit line 12/14 far from the decoder/driver 31. Potentials on the bit lines 12 and 14 near the decoder/driver 31 start to fall earlier, as shown by curves 41 and 42 in FIG. 4, respectively. Potentials on the bit lines 12 and 14 far from the decoder/driver 31 start to fall later, as shown by curves 43 and 44 in FIG. 4, respectively. Thus, the start timing of the bit line potential change differs with the distance of the bit line from the word line decoder/driver 31. Therefore, in the conventional memory device, the timing to render the sense amplifiers 30 active must carefully be selected. To be more specific, if all of the sense amplifiers 30 are made active at time t1 in FIG. 4, the sense amplifier associated with the bit lines 12 and 14, far from the decoder/driver 31, operates for data sensing before a potential difference between these bit lines reaches a satisfactory value. At this time, this sense amplifier can not sense the data. In another case, if all of the sense amplifiers 30 are placed in the active state at time t2 in FIG. 4, both of the potentials 41 and 42 on the bit lines 12 and 14 close to the decoder/driver 31 fall to relatively low potentials. Therefore, also in this case, the sense amplifier 30 associated with these bit lines can not sense the data.

Since the conventional memory device makes all of the sense amplifiers 30 active concurrently, a large peak current flows through a circuitry between the power sources $V_{DD}$ and $V_{SS}$. The peak current produces noise, and the power lines and signal lines of other circuits are floating, possibly causing the memory device to erroneously operate.

SUMMARY OF THE INVENTION

Accordingly, an object of the present invention is to provide a semiconductor memory device which can stably sense data, irrespective of the presence of the word line delay, and reduces the peak current as produced between power sources at the time of data sensing, thereby preventing an erroneous operation of the memory device.

According to the invention, there is provided a semiconductor memory device comprising a plurality of bit line pairs, each pair of bit lines being respectively connected to a memory cell and a dummy cell which are respectively selected by signals derived from word lines, a plurality of means for sensing data by amplifying a potential difference between each pair of bit lines, a plurality of first transistors connected between said data sensing means and a power source for receiving at the gates, with an extremely small time delay, control signals to control the active state of each of said data sensing means, and a plurality of second transistors connected between said data sensing means and the power source and respectively connected in series to said first transistors, and for receiving at the gates said control signals with predetermined time delays.

BRIEF DESCRIPTION OF THE DRAWINGS

FIGS. 6A through 6D show timing charts illustrating the operation of the memory device shown in FIG. 5;

FIG. 7 shows bit line potential variations which are useful in explaining the features of the circuit of FIG. 5;

FIGS. 8 and 9 show peak currents which are useful in explaining the features of the circuit of FIG. 5;

DETAILED DESCRIPTION OF THE PREFERRED EMBODIMENTS

An embodiment of the present invention will be described referring to the accompanying drawings.

Figure 5:
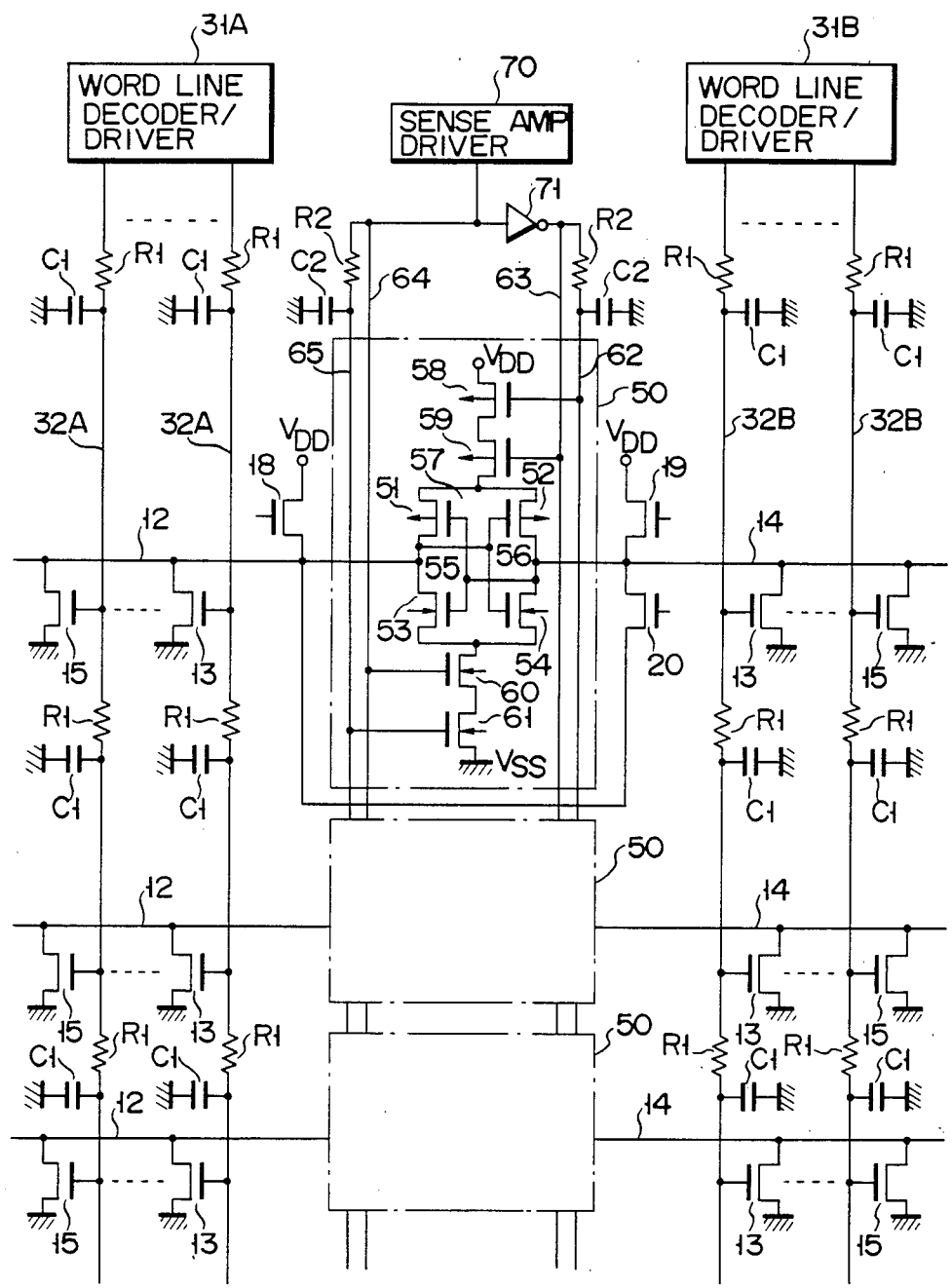
FIG. 5 shows a circuit diagram of a semiconductor memory device according to an embodiment of the present invention.

FIG. 5 shows an arrangement of a semiconductor memory device according to the present invention. As in the prior device, as described also in this memory device, there is contained a plurality of pairs of bit lines 12 and 14. Each pair of bit lines 12 and 14 is coupled with a latch sense amplifiers 50. Each of the paired bit lines 12 and 14 is coupled with a plurality of memory cells 13 and one dummy cell 15. Only one of the memory cells 13 is shown in FIG. 5 for brevity. The gate of each of the memory cells 13 connected to the bit lines 12 is connected to a corresponding one of a plurality of word lines 32Am. Only one of the word lines 32Am is shown for brevity. The gates of the dummy cells 15 connected to the bit lines 12 are connected together to a word line 32Ad. Similarly, the gate of each of the memory cells 13 connected to the bit lines 14 is connected to a corresponding one of a plurality of word lines 32Bm. Only one of the word lines 32Bm is shown for brevity. The gates of the dummy cells 15 connected to the bit lines 14 are connected together to a word line 32Bd. The decoded signal derived from a decoder/driver 31A is supplied to the word lines 32Am and 32Ad. The decoded signal from a word line decoder/driver 31B is supplied to the word lines 32Bm and 32Bd.

The bit line 12/14 (denoting the bit lines 12 and 14) is made of metal such as aluminum. The word line 32 (denoting the word lines 32Am, 32Ad, 32Bm and 32Bd) is made of polycrystal silicon in the form of silicon layers. Therefore, in FIG. 5, a relatively large capacitance and resistance are parasitic on the word line 32. The dimension of each memory cell 13 is selected to be equal to that of each transistor 58 and 61 (referred to later).

Each sense amplifier 50 comprises a flip-flop 57, two P channel MOS transistors 58 and 59, and two N channel MOS 60 and 61. The flip-flop 57 comprises two CMOS inverters 55 and 56, which are cross coupled with each other. The inverter 55 comprises the MOS transistors 51 and 53. The inverter 56 comprises the MOS transistors 52 and 54. The MOS transistors 58 and 59 are connected in series between the flip-flop 57 and the power source $V_{DD}$. The transistors 60 and 61 are connected in series between the flip-flop 57 and the power source $V_{SS}$. The input terminal of the CMOS inverter 56 is connected to the bit line 12. The input terminal of the CMOS inverter 55 is connected to the bit line 14. The gates of the transistors 58, 59, 60 and 61 are connected to sense amplifier control lines 62, 63, 64 and 65, respectively.

A sense amplifier driver 70 detects a change in an address signal, and produces a control signal to set each sense amplifier in an active state. The output signal of the sense amplifier driver 70 is applied through an inverter 71 to the sense amplifier control lines 62 and 63. Further, the output signal of the sense amplifier driver 70 is directly applied to the sense amplifier control lines 64 and 65.

The sense amplifier control lines 62 and 65, like the word line 32, are made of polycrystal silicon in the form of silicon layers. Other conditions, including the line width of these lines 62 and 65, are substantially the same as that of the line 32. The sense amplifier control lines 63 and 64, like the bit line 12/14, are made of metal such as aluminum. Because of the use of polycrystal silicon, the sense amplifier control lines 62 and 65 are accompanied by parasitic capacitor C2 and resistor R2, which are comparable in value with those of the word line 32.

In FIG. 5, for ease of illustration, only one of the sense amplifiers 50 and its related circuit is illustrated in detail.

The operation of the memory device thus arranged will be described referring to timing charts shown in FIGS. 6A to 6D. When a change in the address Add (FIG. 6A) is detected by a means (not shown), the transistors 18, 19 and 20 are turned on for a predetermined period. Then, each bit line pair is charged up to the power potential $V_{DD}$ and set at the same potential. In response to the change in the address signal, the sense amplifier 70 produces a signal P1 (FIG. 6B) with a predetermined pulse width. As shown, the signal P1 rises in synchronism with the change of the address signal Add. The signal P1 is applied, with the same level, to the sense amplifier control line 64, and is inverted by the inverter 71 and then applied to the sense amplifier control line 63. As recalled, the sense amplifier control lines 64 and 63 are made of metal such as aluminum, and cause little delay to the signals. Therefore, the signals on the sense amplifier control lines 64 and 63 are supplied to the transistors 60 and 59 in each sense amplifier 50 with little time delay. Upon receipt of these signals, the transistors 60 and 59 are turned on. The transistors 60 and 59 are turned off in synchronism with the fall of the signal P1. Since the transistors 60 and 59 are in the off-state, no current flows through each flip-flop 57. As a result, the sense amplifiers 50 are all rendered inactive, as shown in FIG. 6D.

The signal P1 is applied, with the same level, to the sense amplifier control line 65, and at the same time is level inverted by the inverter 71 and supplied to the sense amplifier control line 62. As described above, the sense amplifier control lines 65 and 62 are both made of polycrystal silicon. Then, a signal P2 (FIG. 6C) on the sense amplifier control line stays behind the signal P1. The signal of the sense amplifier control line 62 also stays behind the signal on the sense amplifier control line 63. The transistors 61 and 58 in the sense amplifier 50 are turned off in synchronism with the fall of the signal P2, and turned on in synchronism with the rise of the signal P2. Therefore, the flip-flop 57 in each sense amplifier 50 starts to operate at an instant that the signal P2 rises. Thus, each sense amplifier 50, as shown in FIG. 6D, is in the inactive state, i.e. a floating state, from the fall of the signal P1 to the rise of the signal P2. Then, the sense amplifier 50 is not in the active state until the signal P2 rises.

It is assumed that there is a time lag between a signal applied to the gates of the transistors 58 and 61 in a sense amplifier 50 close to the sense amplifier driver 70, and a signal applied to the gates of the transistors 58 and 61 in the sense amplifier 50 by one far from the sense amplifier driver 70. The sense amplifiers 50, as their distances from the sense amplifier driver 70 increase, are sequentially made active, each with the time delay $\Delta t$. As earlier described, the sense amplifier control lines 62 and 65 are made of polycrystal silicon, like the word line 32, and further other conditions including the line width are substantially equal to those of the word line 32. The time delay on the control lines 62 and 65 is substantially equal to those on the word line 32. Thus, the drive signal on the word line 32 is successively delayed by $\Delta t$ as the distance of the word line from the word line driver 31 (expressing the drivers 31A and 31B) increases. Therefore, even if the word line delay is present, data can be sensed at a time point that a potential difference between the paired bit lines 12 and 14 reaches a value high enough to sense the data by each sense amplifier 50. Thus, data sensing can be performed with the best sensitivity of each sense amplifier 50. This state is well depicted in FIG. 6. As seen from FIG. 7, in the memory device shown in FIG. 5, a predetermined potential difference $\Delta V$ between the bit lines 12 and 14 at a location distanced from the sense amplifier driver 70 and the word line decoder/driver 31 is produced. At this time "ta", the sense amplifier 50 associated with the bit lines is placed in the active state. At time "tb" after $\Delta t$ from time "ta", the potential difference $\Delta V$ is also produced between the paried bit lines 12 and 14 located next to the above-mentioned bit line pair, i.e. by one bit line pair farther from the sense amplifier driver and the decoder/driver. The signal on the sense amplifier control lines 62 and 65 is also delayed by $\Delta t$. Therefore, the sense amplifier 50 connected to the bit line pair located here is also placed in the active state at the optimum timing. Thus, each sense amplifier 50 is made active at just the time that predetermined potential difference $\Delta V$ is produced between the paired bit lines associated with that sense amplifier 50. Therefore, each sense amplifier 50 stably detects data.

The semiconductor memory device as mentioned above has the following effects, in addition to the improvement in the sensitivity for data sensing by the sense amplifier. In the conventional memory device, the sense amplifiers are concurrently made active, so that a large peak current flows through the circuitry between the power sources $V_{DD}$ and $V_{SS}$, as indicated by a curve 81 in FIG. 8. By the peak current, noise is produced to place the power lines and the signal lines in other circuits in a floating state. This possibly causes an erroneous operation of the memory device. The peak current often exceeds 100 mA. In the memory device according to the embodiment, the sense amplifiers are set in the active state in a successive manner. The peak current distributes over a wide range with a low magnitude, as indicated by a curve 82 in FIG. 9. The peak current of the embodiment is 20 mA at most. Therefore, the conventional problems have been solved; noise generation, floating of the power lines and signal lines of the other circuits, and erroneous operation of the circuit.

Figure 1:
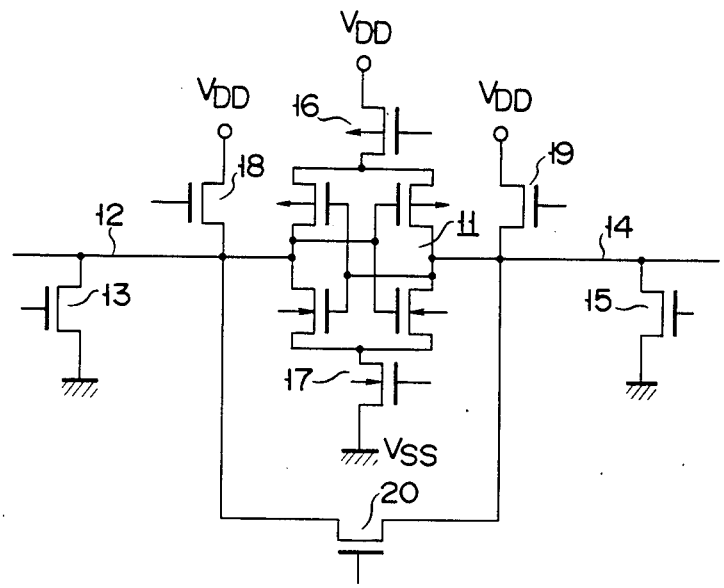
FIG. 1 shows a circuit diagram illustrating a sense amplifier used in a conventional memory device.
Figure 2:
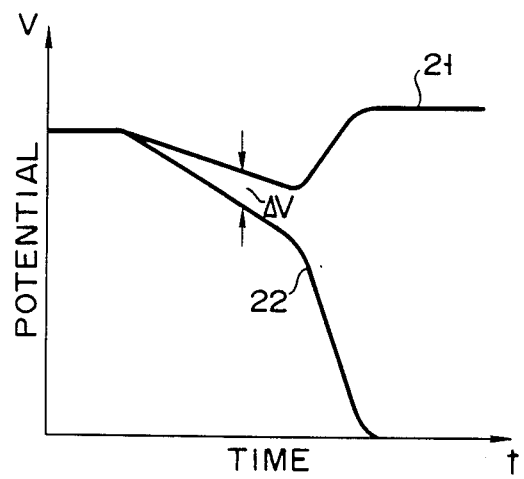
FIG. 2 shows curves representing variations of the potentials on the bit lines.
Figure 3:
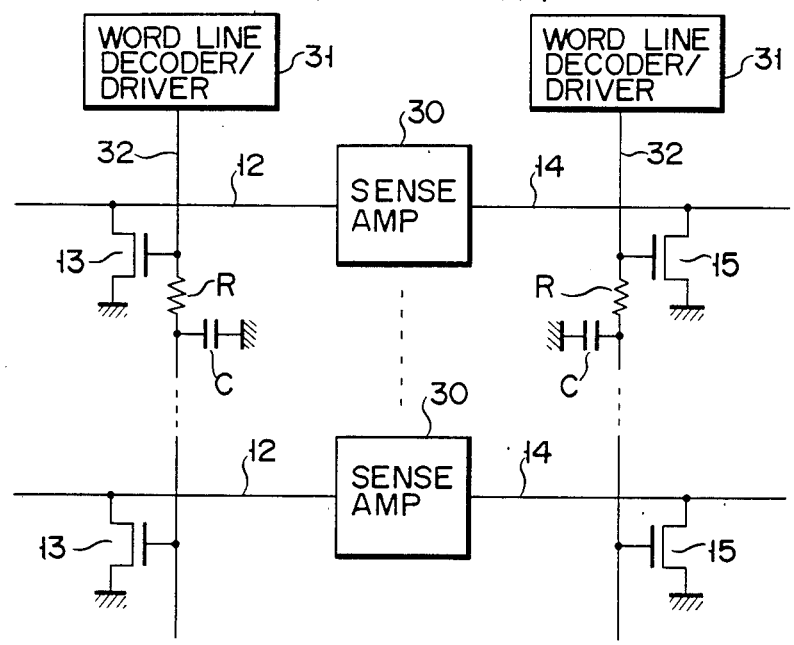
FIG. 3 shows a circuit diagram of a conventional memory device using the sense amplifiers shown in FIG. 1.
Figure 4:
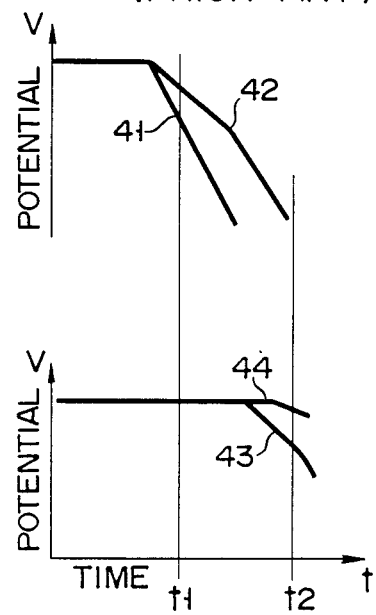
FIG. 4 typically shows curves representing variations of the potentials on bit lines at different distances from the word line decoder/driver.
Figure 10:
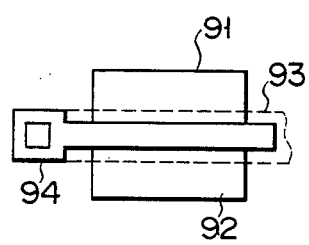
FIG. 10 shows a plan view illustrating a pattern of a part of a conventional memory device.
Figure 11:
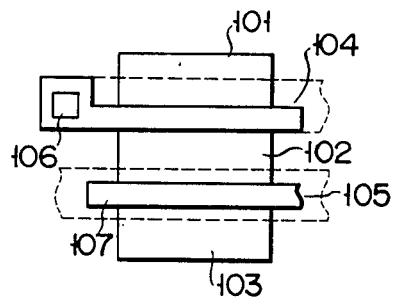
FIG. 11 shows a plan view of a pattern of a part of the memory device used in the embodiment shown in FIG. 5.

In the above embodiment, each sense amplifier requires two additional transistors, in comparison with the conventional sense amplifier 50 shown in FIG. 1. Therefore, the number of transistors required is increased. It is noted, however, that the chip area required is not increased proportionally to the increased number of transistors. This will be described below. FIG. 10 shows a plan view of a pattern of the transistor 16 in the sense amplifier of the circuit of FIG. 1. FIG. 11 shows that of the transistors 58 and 59 in the embodiment of FIG. 5 according to the present invention.

Figure 12:
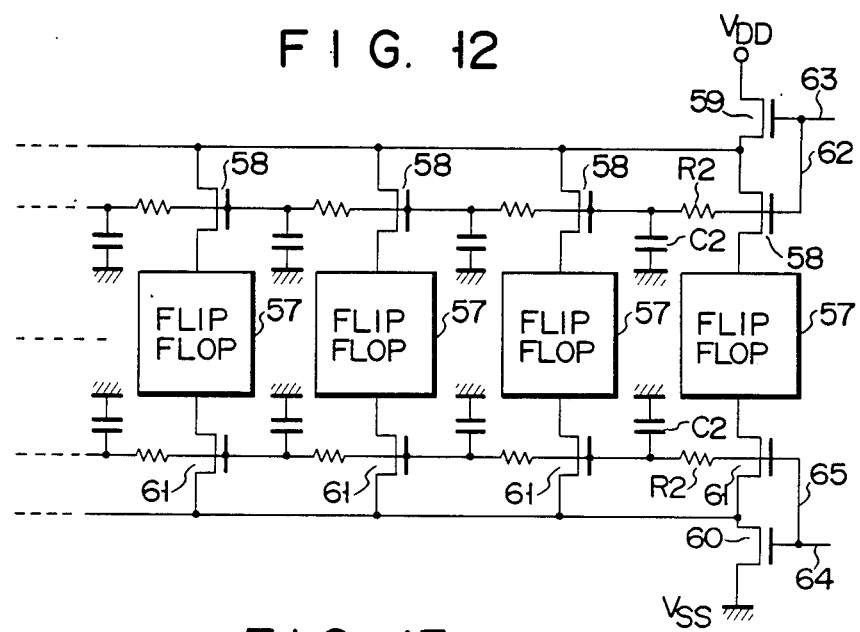
FIG. 12 shows a circuit diagram of a modification of a part of the embodiment of FIG. 5.

FIG. 12 shows a circuit diagram of a modification of a part of the above-mentioned embodiment. In the embodiment of FIG. 5, the transistors 58, 59, 60 and 61 are provided for each flip-flop 57 of the sense amplifier to control the active state of the flip-flop. In this modification, the P-channel transistor 58 and the N channel transistor 61, the gates of which are connected to the signals on the sense control lines 62 and 65, are located closer to the flip-flop 57. The P channel transistor 59 and the N channel transistor 60, the gates of which are connected to the signals on the sense amplifier control lines 63 and 64, are located closer to the power sources $V_{DD}$ and $V_{SS}$. Further, the transistors 59 and 60 are provided in common with the plurality of flip-flops 57. Such an arrangement of the transistors does not require much chip area for their fabrication.

Figure 13:
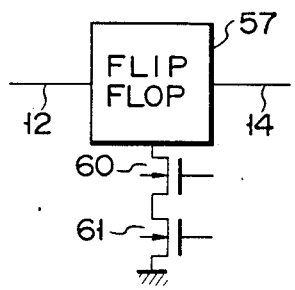
FIG. 13 shows a circuit diagram of a modification of a part of the embodiment of FIG. 5.

FIG. 13 shows a circuit diagram of yet another modification of the memory device according to the present invention. In the embodiment of FIG. 5, in each sense amplifier 50, the transistors 58 and 59 are provided for the P channel side transistors to control the active state of the flip-flop. The transistors 60 and 61 are further provided for the N channel side transistors. In this modification, the transistors 58 and 60 on the P channel side, which are for controlling the active state of each flip-flop, are omitted. The transistors 60 and 61 are provided only on the N channel side. Such an arrangement of the active state control transistors prevents an increase in the chip area required for the transistors.

It should be understood that the present invention is not limited to the above-mentioned embodiments, but may variously be modified within the scope of the present invention. In the above-mentioned embodiments, one sense amplifier is provided for a pair of bit lines. For the memory device of which the memory cell is small in size, a transfer gate to be controlled by a decode signal is connected between a bit line and each sense amplifier. In operation, the transfer gate is selectively turned on to select a memory cell, and to connect the selected one to the sense amplifier.

In the above-mentioned embodiment, the EPROM type cell is employed in which the memory cell 13 and the dummy cell 15 are each made by a single transistor. The present invention is, of course, applicable for a memory device using other types of memory cells, with each cell including a nonvolatile transistor and a select transistor for selecting the former.

Also in the modification of FIG. 13, the transistor 60 may be used in common with the plurality of flip-flops 57, as in the embodiment of FIG. 12.

As seen from the foregoing description, according to the present invention, even when the word line delay is present, each sense amplifier can stably detect data. Further, the peak current flowing through the circuitry between the power sources can be reduced, thereby to prevent an erroneous operation of the memory device.

What is claimed is:

1. A semiconductor memory device comprising:
   a plurality of bit line pairs, the bit lines of each pair being respectively connected to a memory cell and to a dummy cell which are respectively selected by signals derived from word lines;
   a plurality of means for sensing data by amplifying a potential difference between each pair of bit lines;
   a plurality of first transistors each having a gate connected between said data-sensing means and a power source for receiving at the respective gates, with a minimum time delay, a control signal to control the active state of each said data-sensing means; and
   a plurality of second transistors each having a gate connected between said data-sensing means and the power source respectively, said second transistors being connected in series with said first transistors, and for receiving at the respective gates of said second transistors said control signal with predetermined time delays, each of the predetermined time delays being substantially equal to the time delay of a signal on the word line connected to the memory cell associated with the data-sensing means.

2. A semiconductor memory device according to claim 1, in which a capacitance formed at the gate of each of said second transistors is substantially equal to that of the memory cell connected to said word line.

3. A semiconductor memory device according to claim 1, in which said first transistors are each arranged closer to said power source, and said second transistors are each arranged closer to said data-sensing means.

4. A semiconductor memory device according to claim 1, in which each of said data sensing means include a flip-flop circuit.

5. A semiconducting device comprising:
   a plurality of bit line pairs, each pair of bit lines being respectively connected to a memory cell and to a dummy cell which are respectively selected by signals derived from word lines;
   a plurality of means for sensing data by amplifying a potential difference between each pair of bit lines;
   a first transistor having a gate connected between said data-sensing means and the power source for receiving at the gate, with a minimum time delay, a control signal to control the active state of each of said data-sensing means; and
   a plurality of second transistors each having a gate connected between said data-sensing means and the power source respectively, said second transistor being connected in series to said first transistor, and for receiving, at the respective gates, said control signal with predetermined time delays, each of the predetermined time delays being substantially equal to the time delay of a signal on the word line connected to the memory cell associated with the data-sensing means.

6. A semiconductor memory device according to claim 5, in which a capacitance formed at the gate of each of said second transistors is substantially equal to that of the memory cell connected to said word line.

7. A semiconductor memory device according to claim 5, in which said first transistor is arranged closer to said power source, and said second transistors are each arranged closer to said data-sensing means.

8. A semiconductor memory device according to claim 5, in which each of said data-sending means includes a flip-flop circuit.

* * * * *